(12) United States Patent
Spencer et al.

(10) Patent No.: US 7,490,282 B2
(45) Date of Patent: Feb. 10, 2009

(54) METHOD AND APPARATUS OF TURBO ENCODER

(75) Inventors: Paul Spencer, Modiin (IL); Boaz Pianka, Kochav Yair (IL)

(73) Assignee: Intel Corporation, Santa Clara, CA (US)

( * ) Notice: Subject to any disclaimer, the term of this patent is extended or adjusted under 35 U.S.C. 154(b) by 726 days.

(21) Appl. No.: 10/980,808

(22) Filed: Nov. 4, 2004

(65) Prior Publication Data

US 2006/0095827 A1    May 4, 2006

(51) Int. Cl.
*H03M 13/00* (2006.01)
(52) U.S. Cl. .................. 714/755; 714/786; 714/788; 714/762; 714/701; 714/758; 711/157; 711/209; 711/218; 375/350; 375/267
(58) Field of Classification Search .................. 714/753, 714/755, 701, 762, 788, 786; 375/341, 350, 375/267; 711/157, 209, 218
See application file for complete search history.

(56) References Cited

U.S. PATENT DOCUMENTS

| | | | |
|---|---|---|---|
| 7,093,178 B2 * | 8/2006 | Kim et al. ................. 714/748 |
| 2002/0149496 A1 | 10/2002 | Dabak et al. |
| 2003/0135807 A1 | 7/2003 | Lim et al. |
| 2003/0202460 A1 * | 10/2003 | Jung et al. ................. 370/208 |
| 2004/0010743 A1 * | 1/2004 | Lee et al. ................... 714/748 |
| 2004/0139378 A1 | 7/2004 | Akhter et al. |

OTHER PUBLICATIONS

3rd Generation Partnership Project; Technical Specification Group Radio Access Network; Multiplexing and channel coding (FDD), (Release 6), 3GPP TS 25.212 V6.2.0 (Jun. 2004), pp. 16-20.
3rd Generation Partnership Project; Technical Specification Group GSM/EDGE Radio Access Network; Channel coding(Release 6), 3GPP TS 45.003 V6.3.0 (Apr. 2004), pp. 61-67.
3rd Generation Partnership Project; Technical Specification Group GSM/EDGE Radio Access Network; Modulation (Release 5), pp. 5-9.
International Search Report for PCT/US2005/034998, mailed on Feb. 28, 2006.
3rd Generation Partnership Project; Technical Specification Group GSM/EDGE Radio Access Network; Modulation (Release 5), pp. 5-9, no date.

* cited by examiner

*Primary Examiner*—Guy J Lamarre
(74) *Attorney, Agent, or Firm*—Pearl Cohen Zedek Latzer, LLP

(57) ABSTRACT

Briefly, an apparatus, a method and a wireless communication device are provided. The wireless communication device includes a turbo encoder to generate an encoded data block and a transmitter to transmit a data sub-block of the encoded data block in a time slot of a physical channel of the wireless communication system. The encoded data block includes real time data.

23 Claims, 1 Drawing Sheet

METHOD AND APPARATUS OF TURBO ENCODER

BACKGROUND OF THE INVENTION

Wireless communication systems such as, for example, cellular communication systems may include a plurality of modulation and coding schemes. The modulation and coding schemes may be determined by a cellular standard which is used by the wireless communication system. An example for cellular standard may be Global System for Mobile Communications (GSM), General Packet Radio Service (GPRS), Enhanced Data for GSM Evolution (EDGE) and the like.

According to industry standard of third generation of cellular communication system, a logical channel set which termed as Enhanced Circuit Switched Data (E-CSD) may be envisioned as a suitable medium for the provision of video telephony. Video telephony has been targeted by the GSM cellular service providers as a method for providing increased revenue, as compared with regular voice telephony, and as a means of contending with a similar video telephony service provided through wideband Code Division Multiple Access (WCDMA) technology. However, E-CSD, as currently defined in the GSM standard, may not provide a level of quality required by the video telephony service over all the cell coverage area.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features and advantages thereof, may best be understood by reference to the following detailed description when read with the accompanied drawings in which:

Figure 1:
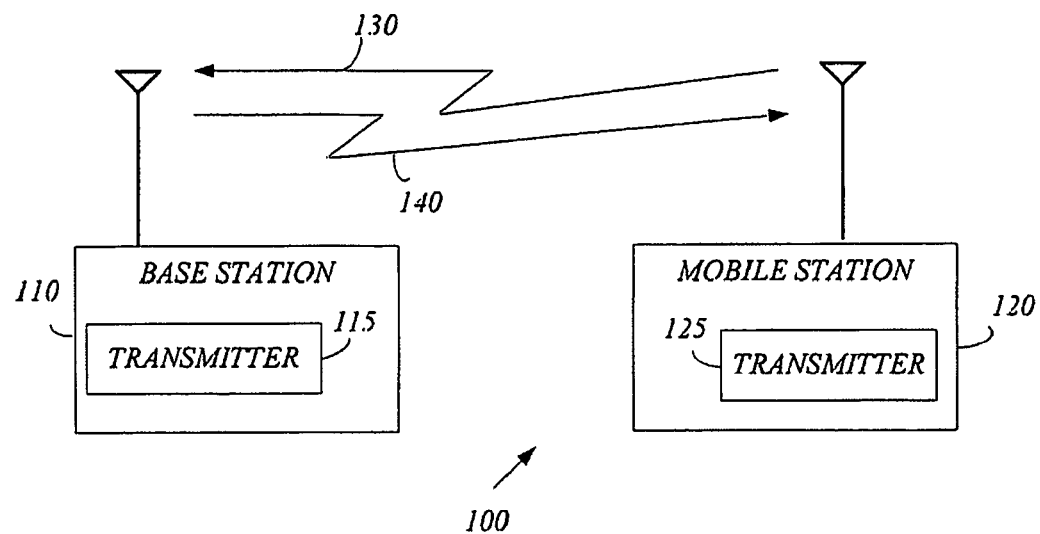
FIG. 1, is an illustration of a portion of a wireless communication system according to an exemplary embodiment of the present invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE INVENTION

In the following detailed description, numerous specific details are set forth in order to provide a thorough understanding of the invention. However it will be understood by those of ordinary skill in the art that the present invention may be practiced without these specific details. In other instances, well-known methods, procedures, components and circuits have not been described in detail so as not to obscure the present invention.

Some portions of the detailed description, which follow, are presented in terms of algorithms and symbolic representations of operations on data bits or binary digital signals within a computer memory. These algorithmic descriptions and representations may be the techniques used by those skilled in the data processing arts to convey the substance of their work to others skilled in the art.

Unless specifically stated otherwise, as apparent from the following discussions, it is appreciated that throughout the specification discussions utilizing terms such as "processing," "computing," "calculating," "determining," or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices. In addition, the term "plurality" may be used throughout the specification to describe two or more components, devices, elements, parameters and the like. For example, "plurality of mobile stations" describes two or more mobile stations It should be understood that the present invention may be used in a variety of applications. Although the present invention is not limited in this respect, the circuits and techniques disclosed herein may be used in many apparatuses such as receivers of a radio system. Receivers intended to be included within the scope of the present invention include, by way of example only, wireless local area network (WLAN) receivers, two-way radio receivers, digital system receivers, analog system receivers, cellular radiotelephone receivers and the like.

Types of cellular radiotelephone systems intended to be within the scope of the present invention include, although are not limited to, Code Division Multiple Access (CDMA) and wideband CDMA (WCDMA) cellular radiotelephone portable devices for transmitting and receiving spread spectrum signals, Global System for Mobile communication (GSM) cellular radiotelephone, Time Division Multiple Access (TDMA), General Packet Radio Service (GPRS), Extended GPRS, and the like.

Some embodiments of the invention may be implemented, for example, using a machine-readable medium or article which may store an instruction or a set of instructions that, if executed by a machine (for example, by stations of wireless communication system, and/or by other suitable machines), cause the machine to perform a method and/or operations in accordance with embodiments of the invention. Such machine may include, for example, any suitable processing platform, computing platform, computing device, processing device, computing system, processing system, computer, processor, or the like, and may be implemented using any suitable combination of hardware and/or software. The machine-readable medium or article may include, for example, any suitable type of memory unit, memory device, memory article, memory medium, storage device, storage article, storage medium and/or storage unit, for example, memory, removable or non-removable media, erasable or non-erasable media, writeable or re-writeable media, digital or analog media, hard disk, floppy disk, Compact Disk Read Only Memory (CD-ROM), Compact Disk Recordable (CD-R), Compact Disk Rewriteable (CD-RW), optical disk, magnetic media, various types of Digital Versatile Disks (DVDs), a tape, a cassette, or the like. The instructions may include any suitable type of code, for example, source code, compiled code, interpreted code, executable code, static code, dynamic code, or the like, and may be implemented using any suitable high-level, low-level, object-oriented, visual, compiled and/or interpreted programming language, e.g., C, C++, Java, BASIC, Pascal, Fortran, Cobol, assembly language, machine code, or the like.

Turning to FIG. 1, a wireless communication system such as, for example, a cellular communication system 100 in accordance with exemplary embodiment of the invention, is shown. Although the scope of the present invention is not limited in this respect, cellular system 100 may include a base station 110, a mobile station 120, an uplink 130 and a downlink 140. Uplink 130 and downlink 140 may include one or more physical channels In some embodiments of the invention, a peer to peer wireless communication may be used. In those embodiments, uplink 130 and downlink 140 may not be used. In accordance with embodiments of the invention, a channel may be depicted as a physical transfer medium that may be used to transfer signals. Furthermore, a channel may be a combination of the physical transfer medium, components of the transmitter and/or receiver and may include channel taps (for example, symbols).

Although the scope of the present invention is not limited in this respect, base station 110 may include an at least a transmitter 115 and mobile station 120 may include an at least a transmitter 125, if desired. According to at least one embodiment of the invention, base station 110 and mobile station 120 may be capable to transmit data and voice over the physical channels of the downlink 140 and uplink 130, respectively. For example, the data may be a video telephony conversation, a voice over internet protocol conversation, interactive game between one mobile station to another mobile station and the like. With embodiments of the invention, transmitters 115 and/or transmitter 120 may transmit a data sub-block of an encoded data block in a time slot of one of the downlink 140 and/or uplink 130 physical channels, if desired. In some embodiments of the invention a turbo encoder may generate the encoded data block which includes real time data such as, for example, video, voice, game data or the like.

Figure 2:
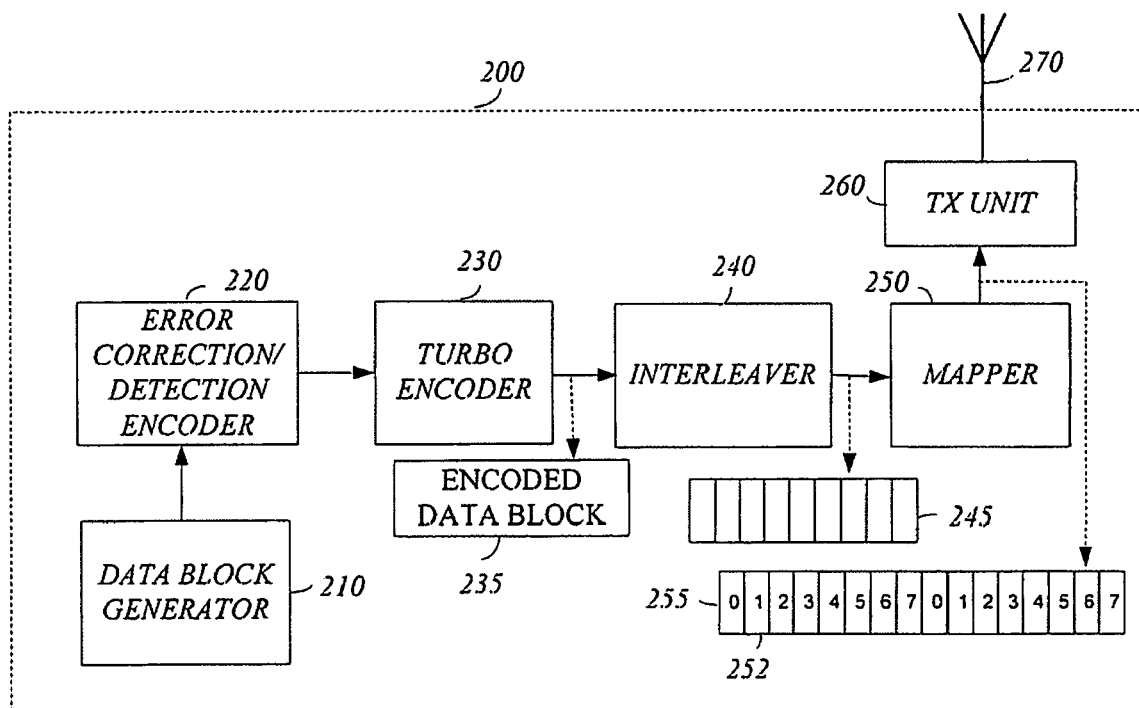
FIG. 2, is an illustration of a block diagram of a communication device according to some exemplary embodiments of the present invention.

Turning to FIG. 2, a block diagram of a communication device 200 of a wireless communication system, according to an exemplary embodiment of the invention is shown. Although the scope of the present invention is not limited in this respect, communication device 200 may be a base station or a mobile station of a cellular system such as, for example GSM, and may include a data block generator 210, a error detection code encoder 220, a turbo encoder 230, an interleaver 240, a mapper 250, a transmitter 260 and an antenna 210.

Although the scope of the present invention is not limited in this respect, with embodiments of the invention, data block generator 220 may generate a data block which include a real time data. For example, the real time data may include voice data packets, video data packets, gaming data packets, music data packets, audio data packets or the like. In some embodiments of the invention, data block generator may be an application such as, for example, a video telephony application, a voice over internet protocol application, a game or the like.

Although the scope of the present invention is not limited in this respect, in some embodiments of the invention error correction/detection code encoder 220 may encode the data block with error correction codes such as for example, cyclical redundancy code (CRC),FIRE code, Reed Solomon code (RS) or the like. In some other embodiments, error correction/detection code encoder 220 may encode the data block with error detection codes such as, for example CRC. It should be understood that some embodiments of the invention may not include error correction/detection code encoder 220.

Although the scope of the present invention is not limited in this respect, turbo encoder 230 may include turbo encoder for parallel code concatenation (PCC), or turbo encoder for serial code concatenation (SCC), or turbo encoder for hybrid code concatenation (HCC) or the like. In one exemplary embodiment of the invention, turbo encoder 230 may receive data block 210 and encode the data block with rate 1/3, if desired.

For example, data block 210 may include 640 bits and turbo encoder 230 may output an encoded data block 235 which includes, for example 1368 bits.

Although the scope of the present invention is not limited in this respect, turbo encoder 230 may output encoded data block 235. In this exemplary embodiment, interleaver 240 may partition the encoded data block into two or more interleaved data sub-blocks 245, wherein two or more interleaved data sub-block 245 may be mapped to two or more physical channels, respectively. For example, the logical channels may be modulated with different modulation schemes according to the GSM modulation schemes e.g. receive Gaussian Minimum Shift Keying (GMSK) and/or 8 phase Slift Keying (8PSK) if desired.

More specifically, in one embodiment of the invention, interleaver 240 may be a diagonal interleaver and the data sub-blocks may be reordered and interleaved according to the following rule:

$i(B,j)=c(n,k)$, for $k=0, 1, \ldots, 1367$
$n=0, 1, \ldots, N, N+1, \ldots$
$B=B0+4n+(k \bmod 19)+(k \text{ div } 342)$
$j=(k \bmod 19)+19(k \bmod 18)$
where, $c(n,k)$—may depict the data block that may enter interleaver 240, wherein n may be a block number and k may be a number of bits in block n;

$i(B,j)$—may depict the data block which output interleaver 240, wherein B may be a number of the output interleaved data block and j may be an index of the bit in a transmitted burst. For example, the result of the interleaving is a distribution of the reordered 1368 bits of encode data block 235, n=N, over 19 data sub-blocks, 18 bits equally distributed in each data sub-block, in a diagonal way over consecutive blocks, if desired.

According to an exemplary embodiment of the invention, the interleaved data sub-block may include 1368 bits. Interleaver 240 and mapper 230 may distribute the bits of the interleaved data sub-block into 22 bursts, if desired. For example, 18 bits may be equally distributed in the first and $22^{nd}$ bursts, 36 bits may be distributed in the second and $21^{st}$ bursts, 54 bits be distributed in the third and $20^{th}$ bursts and 72 bits may be distributed in the other 16 bursts. In this exemplary embodiment of the invention, the encoded data block may be interleaved "diagonal", where a new encoded data block may start with every fourth burst and may be distributed over 22 bursts, if desired.

Although the scope of the present invention is not limited in this respect, mapper 250 may map the bits of an interleaved data sub-block to mapped data sub-blocks also referred in the art as bursts, wherein a bit may be map to two or more mapped data sub-block. The mapped data sub-blocks (e.g. bursts) may be transmitted over two or more time slots 252 of the physical channel For example, mapped data sub-blocks 255 may be include in a frame 252 which may be transmitted within seven time slots 252 (e.g. time slot 0, time slot 1 . . . time slot 7). For example, the bit may be transmitted in time slot 0 and/or in time slot 1 by transmitter unit 260 and antenna 270, if desired.

Although the scope of the present invention is not limited in this respect, in some embodiments of the invention, communication device 200 may be a dual mode mobile station which may operate in two mode of operations such as, for example GSM and WCDMA. In this exemplary embodiment of the invention, turbo encoder 230 may encode the data block according to GSM modulation schemes and according WCDMA modulation schemes, if desired.

Although the scope of the present invention is not limited in this respect, antenna 210 may be an omni-directional antenna, a monopole antenna, a dipole antenna, an end fed antenna, a circularly polarized antenna, a micro-strip antenna, a diversity antenna, an internal antenna, or the like.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

What is claimed is:

1. An apparatus comprising:
a turbo encoder to generate an encoded data block which includes voice and video; and
a transmitter to transmit a data sub-block of the encoded data block within a time slot of a physical channel;
a diagonal interleaver to equally distribute bits of the encoded data block over two or more interleaved data sub-blocks in a diagonal way over consecutive encoded data blocks; and
a mapper to map bits of the two or more interleaved data sub-blocks to a predetermined number N of mapped data sub-blocks, wherein a predetermined number of bits X is to be equally mapped to the first and $N^{th}$ mapped data sub-blocks, a 2*X bits is to be equally mapped to the second and N−1 mapped data sub-blocks, a 3*X bits is to be equally mapped to the third and N−2 mapped data sub-blocks and 4*X bits is to be mapped to other mapped data sub-blocks.

2. The apparatus of claim 1, comprising:
a mobile station of a Global System for Mobile Communications.

3. The apparatus of claim 1, comprising:
a dual mode mobile station, wherein the turbo encoder is able to encode the data block according to a Global System for Mobile Communications (GSM) modulation schemes and according to wideband Code Division Multiple Access (WCDMA) modulation schemes.

4. The apparatus of claim 1, comprising:
a data block generator to generate the data block; and
an error correction code encoder to encode the data block with a correction code.

5. The apparatus of claim 1, comprising:
a data block generator to generate the data block; and
an error detection code encoder to encode the data block with a detection code.

6. The apparatus of claim 1, wherein the mapper is able to start mapping a new encoded data block every fourth mapped data sub-block and distributed the new encoded data block over the N mapped data sub-blocks.

7. A wireless communication device comprising:
a turbo encoder to generate an encoded data block which includes voice and video;
a transmitter operably connected to a dipole antenna to transmit a data sub-block of the encoded data block within a time slot of a physical channel;
a diagonal interleaver to equally distributed bits of the encoded data block over two or more interleaved data sub-blocks in a diagonal way over consecutive encoded data blocks; and
a mapper to map bits of the two or more interleaved data sub-blocks to predetermined number N of mapped data sub-blocks, wherein a predetermined number of bits X is to be equally mapped to the first and $N^{th}$ mapped data sub-blocks, a 2*X bits is to be equally mapped to the second and N−1 mapped data sub-blocks, a 3*X bits is to be equally mapped to the third and N−2 mapped data sub-blocks and 4*X bits is to be mapped to other mapped data sub-blocks.

8. The wireless communication device of claim 7, comprising:
a mobile station of a Global System for Mobile Communications.

9. The wireless communication device of claim 7, comprising:
a dual mode mobile station, wherein the turbo encoder is able to encode the data block according to a Global System for Mobile Communications (GSM) modulation schemes and according to wideband Code Division Multiple Access (WCDMA) modulation schemes.

10. The wireless communication device of claim 7, comprising:
a data block generator to generate the data block; and
an error correction code encoder to encode the data block with a correction code.

11. The wireless communication device of claim 7, comprising:
a data block generator to generate the data block; and
an error detection code encoder to encode the data block with a detection code.

12. The wireless communication device of claim 7, wherein the mapper is able to start mapping a new encoded data block every fourth mapped data sub-block and distribute the new encoded data block over the N mapped data sub-blocks.

13. A wireless communication system comprising:
a wireless communication device to provide video telephony having a turbo encoder to generate an encoded data block which includes voice and video; and
a transmitter to transmit a data sub-block of the encoded data block within a time slot of a physical channel
a diagonal interleaver to equally distribute bits of the encoded data block over two or more interleaved data sub-blocks in a diagonal way over consecutive encoded data blocks; and
a mapper to map bits of the two or more interleaved data sub-blocks to two or more predetermined number N of mapped data sub-blocks, wherein a predetermined number of bits X is to be equally mapped to the first and $N^{th}$ mapped data sub-blocks, a 2*X bits is to be equally mapped to the second and N−1 mapped data sub-blocks, a 3*X bits is to be equally mapped to the third and N−2 mapped data sub-blocks and 4*X bits is to be mapped to the rest mapped data sub-blocks.

14. The wireless communication system of claim 13, wherein the wireless communication device is a mobile station of a Global System for Mobile Communications.

15. The wireless communication system of claim 13, wherein the wireless communication device is a dual mode mobile station and the turbo encoder is able to encode the data block according to a Global System for Mobile Communications (GSM) modulation schemes and according to wideband Code Division Multiple Access (WCDMA) modulation schemes.

16. The wireless communication system of claim 13, wherein the wireless communication device comprises:
a data block generator to generate the data block; and
an error correction code encoder to encode the data block with a correction code.

17. The wireless communication system of claim 13, wherein the wireless communication device comprises:
a data block generator to generate the data block; and an error detection code encoder to encode the data block with a detection code.

18. The wireless communication system of claim 13, wherein the mapper is able to start mapping a new encoded data block every fourth mapped data sub-block and distribute the new encoded data block over the N mapped data sub-blocks.

19. An method comprising:
transmitting a turbo code encoded data block which include video and voice over a dedicated logical channel of Global System for Mobile Communications;
equally distributing bits of the encoded data block over two or more interleaved data sub-blocks in a diagonal way over consecutive encoded data blocks; and
mapping bits of the two or more interleaved data sub-blocks to a predetermined number N of mapped data sub-blocks, wherein a predetermined number of bits X is to be equally mapped to the first and $N^{th}$ mapped data sub-blocks, a 2*X bits is to be equally mapped to the second and N−1 mapped data sub-blocks, a 3*X bits is to be equally mapped to the third and N−2 mapped data sub-blocks and 4*X bits is to be mapped to the rest of the mapped data sub-blocks.

20. The method of claim 19, wherein encoding comprises:
encoding the turbo code encoded data block with an error correction code.

21. The method of claim 19, wherein encoding comprises:
encoding the turbo code encoded data block with an error detection code.

22. The method of claim 19, comprising:
transmitting the two or more mapped data sub-blocks within two or more time slots of the physical channel.

23. The method of claim 19, wherein mapping further comprises:
start mapping a new encoded data block every forth mapped data sub-block and distributing the new encoded data block over the N mapped data sub-blocks.

* * * * *